(12) United States Patent
Thies

(10) Patent No.: US 8,854,071 B2
(45) Date of Patent: Oct. 7, 2014

(54) TEST PROD FOR HIGH-FREQUENCY MEASUREMENT

(75) Inventor: Steffen Thies, Ueberackern (AT)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 467 days.

(21) Appl. No.: 13/257,851

(22) PCT Filed: Mar. 1, 2010

(86) PCT No.: PCT/EP2010/001251
§ 371 (c)(1),
(2), (4) Date: Nov. 1, 2011

(87) PCT Pub. No.: WO2010/105736
PCT Pub. Date: Sep. 23, 2010

(65) Prior Publication Data
US 2012/0038381 A1    Feb. 16, 2012

(30) Foreign Application Priority Data

Mar. 20, 2009  (DE) .................. 20 2009 003 966 U

(51) Int. Cl.
*G01R 1/067*    (2006.01)

(52) U.S. Cl.
CPC .............................. *G01R 1/06772* (2013.01)
USPC ............ 324/755.01; 324/755.07; 324/754.11; 324/754.07

(58) Field of Classification Search
CPC ........ G01R 1/06772; G01R 1/02; G01R 1/06; G01R 1/067
USPC .............. 324/755.01, 755.07, 754.11, 754.07
See application file for complete search history.

(56) References Cited

U.S. PATENT DOCUMENTS

| 5,225,797 | A | * | 7/1993 | Schary et al. .................. 333/125 |
| 5,565,788 | A | * | 10/1996 | Burr et al. ................. 324/750.27 |
| 6,051,978 | A | * | 4/2000 | Swart ............................. 324/537 |
| 6,229,321 | B1 | * | 5/2001 | Matsunaga et al. ...... 324/754.03 |
| 7,042,236 | B1 | * | 5/2006 | Wollitzer .................. 324/755.02 |
| 7,501,842 | B2 | * | 3/2009 | Gleason et al. ........... 324/755.07 |
| 8,319,503 | B2 | * | 11/2012 | Negishi et al. ................. 324/613 |

FOREIGN PATENT DOCUMENTS

DE    19945178 A1    8/2001

\* cited by examiner

*Primary Examiner* — Arleen M Vazquez
*Assistant Examiner* — Robert P Alejnikov, Jr.
(74) *Attorney, Agent, or Firm* — DeLio, Peterson & Curcio LLC; Robert Curcio

(57) ABSTRACT

A test prod for high-frequency measurement having a contact-side end for electrically contacting planar structures and a cable-side end, for connecting to a cable, wherein between the contact-side end and the cable-side end a coplanar conductor structure having at least two conductors is arranged, wherein on the coplanar conductor structure a dielectric is arranged over a predetermined section between the cable-side end and the contact-side end, wherein the test prod is between the dielectric and the contact-side end such that the conductors of the coplanar conductor structure are arranged freely in space and relative to the dielectric in a suspending manner, wherein on one side of the test prod facing towards the planar structure a shielding element is arranged extending into the area of the coplanar conductor structure.

16 Claims, 2 Drawing Sheets

TEST PROD FOR HIGH-FREQUENCY MEASUREMENT

This application claims priority from PCT Application No. PCT/EP2010/001251 filed Mar. 1, 2010, which claims priority from German Application No. DE 20 2009 003 966.8, filed Mar. 20, 2009.

BACKGROUND OF THE INVENTION

1. Field of the Invention

The present invention relates to a test prod for high-frequency measurement having a contact-side end for electrically contacting planar structures and a cable-side end, in particular a coaxial cable-side end, for connecting to a cable, in particular a coaxial cable, wherein between the contact-side end and the cable-side end a coplanar conductor structure with at least two conductors, in particular three conductors, is arranged, wherein on the coplanar conductor structure a dielectric supporting the coplanar conductor structure is arranged over a predetermined section between the cable-side end and the contact-side end, one-sided or both-sided, wherein the test prod is designed between the dielectric and the contact-side end such that the conductors of the coplanar conductor structure are arranged freely in space and relative to the supporting dielectric in a suspending manner.

2. Description of Related Art

Such a test prod is for example known from DE 199 45 178 A1. This has the advantage that a test prod with impedance control is made available which can be manufactured economically and to high precision, even in mass production, so that minimal reflections occur during contacting with the planar structure for measuring purposes. The arrangement according to the invention is characterized by operating frequencies of up to 40 to 60 GHz or higher, wherein, due to the design according to the invention, the impedance is substantially dispersion-free, i.e., independent of the operating frequency, over the entire coplanar conductor structure. The freely suspended arrangement of the conductors of the coplanar conductor structure between the dielectric and the coaxial cable-side end means that a high contact quality is guaranteed between all conductors of the coplanar conductor structure and corresponding contact points of a device which is to be measured, wherein the contact quality is not sensitive in terms of the test prod being placed at an angle on the contact points of the planar structure.

A shielded microwave test prod is known from U.S. Pat. No. 5,565,788 with an end of a coaxial cable which is connected with probe fingers which form a coplanar conductor with ground probe fingers and a signal probe finger. The ground probe fingers are connected with one another via a shielding element. The shielding element is spaced at a distance from the signal probe finger and arranged between this and the device under test in order to prevent the generation of extraneous signals or parasitic coupling from the device under test which would otherwise degrade measurement accuracy.

SUMMARY OF THE INVENTION

The invention is based on the problem of further improving a test prod of the aforementioned type in terms of its electrical properties.

According to the invention, this problem is solved through a test prod of the aforementioned type. Advantageous embodiments of the invention are described in the claims.

The above and other objects, which will be apparent to those skilled in the art, are achieved in the present invention which is directed to a test prod for high-frequency measurement including: a contact-side end for electricity contacting planar structures and a cable-side end for connecting to a cable; a coplanar conductor structure, arranged between the contact-side end and the cable-side end, having at least two conductors; a dielectric on the coplanar structure, supporting the coplanar conductor structure, is arranged over a predetermined section between the cable-side end and the contact-side end, one-sided or both-sided, wherein the test prod is designed between the dielectric and the contact-side end such that the conductors of the coplanar conductor structure are arranged freely in space and relative to the supporting dielectric in a suspending manner; a shielding element arranged on one side of the test prod facing towards the planar structure, contacting said planar structure, and designed such that the shielding element extends into the area of the coplanar conductor structure which is arranged freely in space and relative to the supporting dielectric in a suspending manner between the dielectric and the contact-side end; wherein the test prod possesses a housing made of an electrically conductive material; and wherein the shielding element is electrically connected with the housing.

The shielding element may comprise an electrically conductive material. The shielding element may also be electrically connected with at least one conductor of the coplanar conductor structure which is arranged suspended freely in space and resiliently in relation to the supporting dielectric.

The shielding element is, at an end facing the contact-side end of the test prod, electrically connected with at least one conductor of the coplanar conductor structure which is arranged suspended freely in space and resiliently in relation to the supporting dielectric.

The shielding element is, in addition, mechanically connected with the at least one conductor of the coplanar conductor structure which is arranged suspended freely in space and resiliently in relation to the supporting dielectric.

The conductor of the coplanar conductor structure with which the shielding element is electrically or mechanically connected may be a ground conductor.

The coplanar conductor structure may possess three conductors, including a central conductor as a signal conductor and the other two conductors as ground conductors.

The test prod may further include an additional shielding element arranged and designed on a side opposite the side of the test prod such that the additional shielding element extends into the area of the coplanar conductor structure which is suspended freely in space and resiliently in relation to the supporting dielectric, between the dielectric and the contact-side end.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
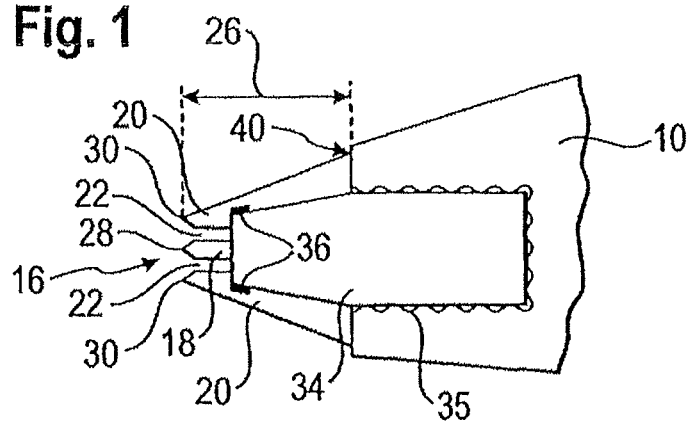
FIG. 1 shows a preferred embodiment of a test prod according to the invention in a view from below of a side facing a planar conductor structure.

In describing the preferred embodiment of the present invention, reference will be made herein to FIGS. 1-5 of the drawings in which like numerals refer to like features of the invention.

In a test prod of the aforementioned type, according to the invention a shielding element is arranged and designed on one side of the test prod, which on contacting the planar structure faces said planar structure, such that the shielding element extends into the area of the coplanar conductor structure which is suspended freely in space and resiliently in relation to the supporting dielectric, between the dielectric and the contact-side end, wherein the test prod possesses a housing made of an electrically conductive material, wherein the shielding element is electrically connected with the housing.

This has the advantage that the coplanar conductor structure which is suspended freely in space and resiliently in relation to the supporting dielectric is electrically shielded from the planar structure, so that an undesired crosstalk of electrical signals from the planar conductor structure into the freely suspended part of the coplanar conductor structure is effectively prevented and at the same time undesired electrical effects, in particular in terms of calibration, are avoided or at least significantly reduced due to the proximity between the coplanar conductor structure and planar structure.

A particularly good electrical shielding of the planar structure combined with a small thickness of the shielding element of the coplanar conductor structure is achieved in that the shielding element is manufactured of an electrically conductive material.

In a preferred embodiment, the shielding element is electrically connected with at least one conductor of the coplanar conductor structure which is arranged suspended freely in space and resiliently in relation to the supporting dielectric.

Advantageously, the shielding element is electrically connected, at an end facing the contact-side end of the test prod, with at least one conductor of the coplanar conductor structure which is arranged suspended freely in space and resiliently in relation to the supporting dielectric.

A particularly simple establishment of an electrical contact between shielding elements and a conductor of the coplanar conductor structure is achieved in that the shielding element is, in addition, mechanically connected with the at least one conductor of the coplanar conductor structure which is arranged suspended freely in space and resiliently in relation to the supporting dielectric.

In a preferred embodiment, the conductor of the coplanar conductor structure with which the shielding element is electrically or mechanically connected is a ground conductor.

In a preferred embodiment, the coplanar conductor structure possesses three conductors, wherein a central conductor is a signal conductor and two conductors are ground conductors.

For further improvement of the shielding, an additional element is arranged and designed on a side opposite the side of the test prod such that the additional shielding element extends into the area of the coplanar conductor structure which is suspended freely in space and resiliently in relation to the supporting dielectric, between the dielectric and the contact-side end.

The preferred embodiment of a test prod according to the invention illustrated in FIGS. 1 to 5 comprises a housing 10, a coaxial cable-side end 12 with a coaxial plug connector 14 for connection with a coaxial cable (not shown), a contact-side end 16 for contacting a planar structure 38 and a coplanar conductor structure with a central signal conductor 18 and two ground conductors 20 arranged between the coaxial cable-side end 12 and the contact-side end 16. A gap 22 is formed between the signal conductor 18 and the adjacent ground conductors 20 of the coplanar conductor structure. This gap 22 is formed over the entire length of the coplanar conductor structure 18, 20 such that a constant, predetermined characteristic impedance is achieved.

In a central section between the coaxial cable-side end 12 and the contact-side end 16, the coplanar conductor structure 18, 20 is held by a dielectric 24 (FIG. 4), for example in the form of a quartz block, wherein the dielectric 24 is arranged on one side or on both sides of the coplanar conductor structure 18, 20, so that the coplanar conductor structure 18, 20 is held on each side by a dielectric 24. The dielectric 24 and the coplanar conductor structure 18, 20 are laid together in a sandwich-like structure. The dielectric 24 is solidly connected with the coplanar conductor structure 18, 20 and, on a side facing the coplanar conductor structure 18, 20, carries a metallization which substantially corresponds to the shape of the coplanar conductor structure 18, 20 in the area of the dielectric 24. In this way, a particularly strong and close connection between the dielectric 24 and the conductors 18, 20 of the coplanar conductor structure is achieved. Due to the electromagnetic relationship with the dielectric 24, the gap 22 widens in the area of the dielectric 24, so that overall a constant characteristic impedance is achieved over the entire length of the coplanar conductor structure 18, 20 from coaxial cable-side end 12 to the contact-side end 16. The dielectric 24 is embedded in the housing 10 in such a way that the dielectric 24 is aligned flush with an end 40 of the housing facing the contact-side end 16.

The conductors 18, 20 are arranged freely in space in an area 26 between the dielectric 24 and the contact-side end 16, so that each of the conductors 18, 20, is individually resilient with respect to its mounting in the dielectric 24. If the contact-side end 16 of the test prod is mechanically pressed against corresponding contact points on the planar structure 38, for example an electrical circuit which is to be tested, then the possibility of each individual conductor 18, 20 of the coplanar conductor structure being freely resilient means that each individual conductor 18, 20 has an optimal electrical contact with the contact point assigned to it. Any tilting of the test prod while being mechanically pressed against the contact points and any tolerances, both in the conductors 18, 20 themselves and also in the surfaces of the contact points of the planar structure 38, are compensated through the resilience of the individual conductors 18, 20. As a result, each time the conductors 18, 20 are applied mechanically to corresponding contact points, an always-identical and defined contact is established, so that optimal measuring results can be achieved with the test prod according to the invention.

The representation of the test prod with three conductors 18, 20 in the arrangement ground-signal-ground or g-s-g (g=ground; s=signal) is simply intended as an example. Naturally, coplanar conductor structures with only two conductors 18, 20 or more than three conductors 18, 20 are also possible, with the signal conductors and ground conductors being divided as follows: g-s-g-s-g-s-g . . . or g-s-g-g-s-g-g-s-g-g . .

. or similar. In this way, electrical circuits which are to be tested which have several coplanar signal conductors with contact points on the planar structure can also be contacted using a single test prod.

Optionally, the dielectric 24 is metalized (not shown) over its entire surface on a side facing away from the coplanar conductor structure 18, 20. This metallization leads, on the one hand, to the suppression of undesired higher-order modes outside of the desired operating frequency and at the same time creates a closed system over a predetermined area of the coplanar conductor structure 18, 20.

At the contact-side end 16, the conductors 18, 20 of the coplanar conductor structure narrow to a point 28 of the signal conductor 18 and to points 30 of the ground conductors 20 to form an arrangement of the conductors 18, 20 which corresponds to an arrangement of contact points of the planar structure 38 which are to be contacted, in particular an electrical circuit which is to be tested.

A particularly outstanding property of the test prod according to the invention as shown in FIGS. 1 to 4 is that the impedance established by means of the gap 22 is, throughout the coplanar conductor structure 18, 20, substantially dispersion-free, i.e., the impedance and the phase velocity are substantially independent of the operating frequency.

Figure 2:
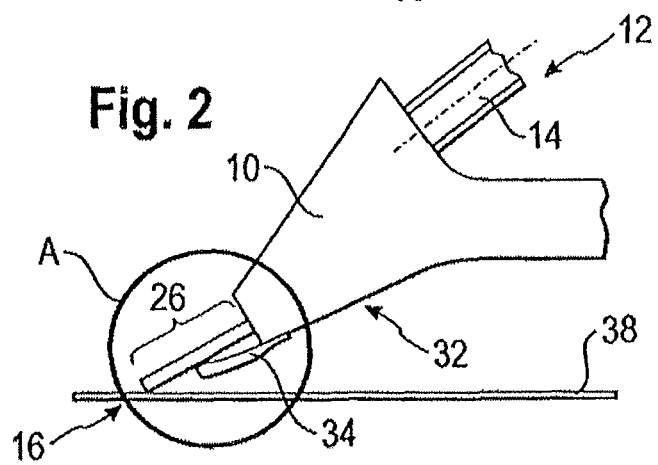
FIG. 2 shows a side view of the test prod in accordance with FIG. 1.
Figure 3:
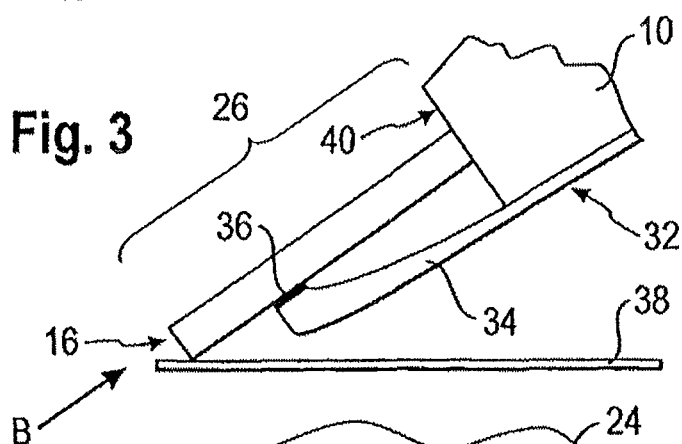
FIG. 3 shows an enlarged detail view of the area A of FIG. 2.
Figure 4:
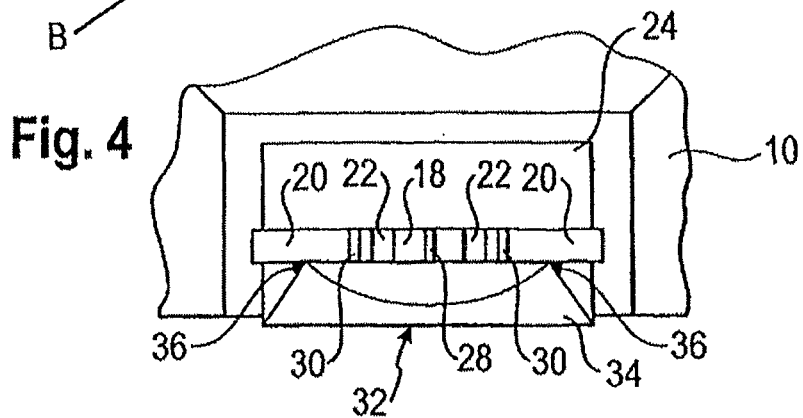
FIG. 4 shows a frontal view of the test prod in accordance with FIG. 1 showing a contact-side end of the test prod in the direction of arrow B of FIG. 3.

According to the invention, a shielding element 34 is, in addition, arranged on a side 32 of the test prod, which, when the test prod is used to contact contact-points on the planar structure 38, faces this (see FIGS. 2 and 3). FIG. 1 shows a view of said side 32 of the test prod. This shielding element 34 extends between the coaxial cable-side end 12 and the contact-side end 16 into the area 26 in which the conductors 18, 20 are freely suspended in space.

When the test prod is used to contact contact-points on the planar structure 38, this shielding element 34 is thus arranged, spatially, between the planar structure 38 and the coplanar conductor structure 18, 20, as can be seen from FIGS. 2 and 3, and accordingly shields the coplanar conductor structure 18, 20 electrically and electromagnetically from the planar structure 38 or the circuit which is to be tested. This effectively prevents or at least significantly reduces undesired influences of the planar structure 38 on the test prod or the coplanar conductor structure 18, 20. These undesired influences include, for example, the intrusion or crosstalk of electrical signals originating from the planar structure 38 into the coplanar conductor structure 18, 20 or changes in the electrical properties of the coplanar conductor structure 18, 20, for example with respect to calibration. All this leads to undesired changes in the measuring results when testing the planar structure 38 with the test prod.

The shielding element 34 is connected with the housing 10 in an electrically conductive manner, as indicated with 35 in FIG. 1. The housing 10 is preferably manufactured of an electrically conductive material and is electrically connected with a ground contact by means of a corresponding electrical connection, so that the housing 10 and thus also the shielding element 34 form a defined ground level. Advantageously, the shielding element 34 is also manufactured of an electrically conductive material, so that a shielding is already achieved with a small thickness of the shielding element 34.

Figure 5:
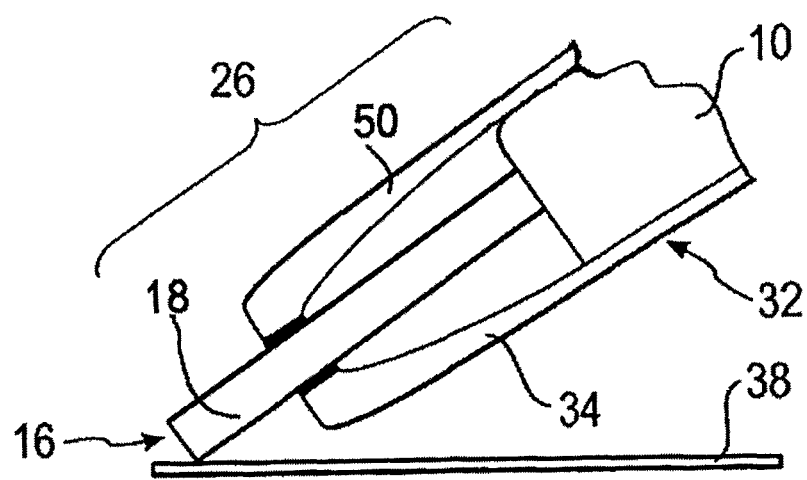
FIG. 5 shows a side view of the test prod in accordance with FIG. 1 with an additional shield attached.

For further improvement of the shielding function of the shielding element 34, this is electrically connected with the two ground conductors 20, on an end facing the contact-side end 16 of the test prod, via contact points 36. The movability of the measuring conductor 20 in the area 26 is only affected to an insignificant degree through a corresponding moveable or flexible design of the shielding element 34. As depicted in FIG. 5, an additional shielding element 50 is arranged and designed on a side opposite the side of the test prod such that the additional shielding element extends into the area of the coplanar conductor structure.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A test prod for high-frequency measurement including:
a contact-side end for electrically contacting planar structures and a cable-side end for connecting to a cable;
a coplanar conductor structure, arranged between the contact-side end and the cable-side end, having at least two conductors;
a dielectric on the coplanar structure, supporting the coplanar conductor structure, arranged over a predetermined section between the cable-side end and the contact-side end, one-sided or both-sided, wherein the test prod is designed between the dielectric and the contact-side end such that the conductors of the coplanar conductor structure are arranged freely in space and relative to the supporting dielectric in a suspending manner;
a flexible shielding element arranged on one side of the test prod that faces towards the planar structure when said test prod contacts said planar structure, and designed such that the shielding element extends into the area of the coplanar conductor structure which is arranged freely in space and relative to the supporting dielectric in a suspending manner between the dielectric and the contact-side end;
wherein the test prod possesses a housing made of an electrically conductive material; and
wherein the shielding element is electrically connected with the housing.

2. The test prod of claim 1 wherein the shielding element comprises an electrically conductive material.

3. The test prod of claim 1 wherein the shielding element is electrically connected with at least one conductor of the coplanar conductor structure which is arranged suspended freely in space and resiliently in relation to the supporting dielectric.

4. The test prod of claim 3 wherein the shielding element is, at an end facing the contact-side end of the test prod, electrically connected with at least one conductor of the coplanar conductor structure which is arranged suspended freely in space and resiliently in relation to the supporting dielectric.

5. The test prod of claim 3 wherein the shielding element is, in addition, mechanically connected with the at least one conductor of the coplanar conductor structure which is arranged suspended freely in space and resiliently in relation to the supporting dielectric.

6. The test prod of claim 3 wherein the conductor of the coplanar conductor structure with which the shielding element is electrically or mechanically connected is a ground conductor.

7. The test prod of claim 1 wherein the coplanar conductor structure possesses three conductors, including a central conductor as a signal conductor and the other two conductors as ground conductors.

8. The test prod of claim 1 including an additional shielding element arranged and designed on a side opposite the side of the test prod such that the additional shielding element extends into the area of the coplanar conductor structure which is suspended freely in space and resiliently in relation to the supporting dielectric, between the dielectric and the contact-side end.

9. The test prod of claim 4 wherein the shielding element is, in addition, mechanically connected with the at least one conductor of the coplanar conductor structure which is arranged suspended freely in space and resiliently in relation to the supporting dielectric.

10. The test prod of claim 4 wherein the conductor of the coplanar conductor structure with which the shielding element is electrically or mechanically connected is a ground conductor.

11. The test prod of claim 5 wherein the conductor of the coplanar conductor structure with which the shielding element is electrically or mechanically connected is a ground conductor.

12. The test prod of claim 3 wherein the coplanar conductor structure possesses three conductors, including a central conductor as a signal conductor and the other two conductors as ground conductors.

13. The test prod of claim 5 wherein the coplanar conductor structure possesses three conductors, including a central conductor as a signal conductor and the other two conductors as ground conductors.

14. The test prod of claim 3 including an additional shielding element arranged and designed on a side opposite the side of the test prod such that the additional shielding element extends into the area of the coplanar conductor structure which is suspended freely in space and resiliently in relation to the supporting dielectric, between the dielectric and the contact-side end.

15. The test prod of claim 5 including an additional shielding element arranged and designed on a side opposite the side of the test prod such that the additional shielding element extends into the area of the coplanar conductor structure which is suspended freely in space and resiliently in relation to the supporting dielectric, between the dielectric and the contact-side end.

16. The test prod of claim 7 including an additional shielding element arranged and designed on a side opposite the side of the test prod such that the additional shielding element extends into the area of the coplanar conductor structure which is suspended freely in space and resiliently in relation to the supporting dielectric, between the dielectric and the contact-side end.

\* \* \* \* \*